(12) United States Patent
Parkhe et al.

(10) Patent No.: US 12,733,443 B2
(45) Date of Patent: Sep. 8, 2026

(54) ELECTROSTATIC CLAMP HAVING CHARGE CONTROL ASSEMBLY

(71) Applicant: Applied Materials, Inc., Santa Clara, CA (US)

(72) Inventors: Vijay D. Parkhe, San Jose, CA (US); Kevin Richard Verrier, Hampton, NH (US)

(73) Assignee: Applied Materials, Inc., Santa Clara, CA (US)

( * ) Notice: Subject to any disclaimer, the term of this patent is extended or adjusted under 35 U.S.C. 154(b) by 150 days.

(21) Appl. No.: 18/508,077

(22) Filed: Nov. 13, 2023

(65) Prior Publication Data

US 2024/0371675 A1 Nov. 7, 2024

Related U.S. Application Data

(60) Provisional application No. 63/499,910, filed on May 3, 2023.

(51) Int. Cl.
*H01L 21/683* (2006.01)
*H10P 72/72* (2026.01)

(52) U.S. Cl.
CPC .................................. *H10P 72/722* (2026.01)

(58) Field of Classification Search
CPC ........................ H01L 21/6833; H01L 21/6831
See application file for complete search history.

(56) References Cited

U.S. PATENT DOCUMENTS 5,151,845 A * 9/1992 Watanabe ............. H10P 72/722 279/128
5,255,153 A * 10/1993 Nozawa ................ H10P 72/722 361/234
5,311,452 A * 5/1994 Yokota .................. G01L 27/002 702/98
5,528,451 A * 6/1996 Su ........................... H10P 72/72 361/234
5,665,167 A * 9/1997 Deguchi ............. C23C 16/4586 427/535
5,812,362 A * 9/1998 Ravi ................... H01L 21/6875 279/128
5,822,171 A * 10/1998 Shamouilian ..... C23C 16/45521 279/128

(Continued)

FOREIGN PATENT DOCUMENTS

TW 201413869 A 4/2014
TW 201807770 A 3/2018

OTHER PUBLICATIONS

International Search Report and Written Opinion for The International Application No. PCT/US2024/026830, mailed on Aug. 26, 2024, 10 pages.

*Primary Examiner* — Thienvu V Tran
*Assistant Examiner* — Muaamar Qahtan Al-Taweel
(74) *Attorney, Agent, or Firm* — KDW Firm PLLC

(57) ABSTRACT

An electrostatic clamp system may include a conductive base; a ceramic body, having an inner side that is attached to the conductive base, and an outer side to face a substrate, the ceramic body including an electrode assembly; and a charge control assembly, the charge control assembly defining an electrically conductive structure that is isolated from the electrode assembly and extends through the conductive base to an upper surface of the outer side of the ceramic body.

20 Claims, 6 Drawing Sheets

(56) References Cited

U.S. PATENT DOCUMENTS

| | | | | |
|---|---|---|---|---|
| 7,981,262 | B2 * | 7/2011 | Pavloff | H01J 37/32623 118/721 |
| 8,043,433 | B2 * | 10/2011 | Bhatnagar | H10P 72/722 118/728 |
| 9,127,362 | B2 * | 9/2015 | Scheible | C23C 14/3407 |
| 10,825,645 | B2 | 11/2020 | Wilson | |
| 2010/0265631 | A1 | 10/2010 | Stone | |
| 2012/0200980 | A1 * | 8/2012 | Blake | H10P 72/72 361/212 |
| 2013/0284709 | A1 * | 10/2013 | Makhratchev | H10P 72/722 29/874 |
| 2022/0044959 | A1 | 2/2022 | Hong | |

* cited by examiner 300
120
302
136
134
140
104
110
116
x
y
z 200
302
110
132
104
134
102
x
y
z PLACING SUBSTRATE ON ELECTROSTATIC CLAMP SYSTEM, WHEREIN ELECTROSTATIC CLAMP SYSTEM COMPRISES CHANGE CONTROL ASSEMBLY
602

ELECTRICALLY DISCONNECTING THE SURFACE COATING TO EXTERNAL GROUND
604

ELECTRICALLY CONNECTING THE SURFACE COATING VIA CHARGE CONTROL ASSEMBLY TO EXTERNAL GROUND
606

PLACING SUBSTRATE ON ELECTROSTATIC CLAMP SYSTEM, WHEREIN ELECTROSTATIC CLAMP SYSTEM COMPRISES CHARGE CONTROL ASSEMBLY
702

ELECTRICALLY DISCONNECTING THE SURFACE COATING TO EXTERNAL VOLTAGE SOURCE
704

ELECTRICALLY CONNECTING SURFACE COATING VIA CHARGE CONTROL ASSEMBLY TO EXTERNAL VOLTAGE SOURCE.
706

PLACING SUBSTRATE ON ELECTROSTATIC CLAMP SYSTEM, WHEREIN ELECTROSTATIC CLAMP SYSTEM COMPRISES CHARGE CONTROL ASSEMBLY
802

PROCESSING SUBSTRATE WHILE SUBSTRATE IS CLAMPED TO ELECTROSTATIC CLAMP SYSTEM
804

ELECTRICALLY CONNECTING SURFACE COATING VIA CHARGE CONTROL ASSEMBLY TO EXTERNAL VOLTAGE SOURCE.
806

ELECTROSTATIC CLAMP HAVING CHARGE CONTROL ASSEMBLY

CROSS-REFERENCE TO RELATED APPLICATIONS

This application claims the benefit of priority under 35 U.S.C. § 119 to U.S. Provisional Application Ser. No. 63/499,910, filed May 3, 2023. The content of the prior application is incorporated herein by reference in its entirety.

FIELD

The present embodiments relate to substrate processing, and more particularly, to electrostatic clamps for holding substrates.

BACKGROUND

Substrate holders such as electrostatic clamps are used widely for many manufacturing processes including semiconductor manufacturing, solar cell manufacturing, and processing of other components. During clamping of a substrate using an electrostatic clamp, undue charge may accumulate on the substrate. When unloading a substrate from the electrostatic clamp after processing, excess charge present may hinder declamping of the substrate. Approaches to address substrate charge buildup include providing a conductive material on the outside sides of an electrostatic clamp, which conductive material may be exposed to process gases, leading to erosion and contamination. The side conductive material may also have to cover a gap region between a metal base and ceramic, which region may be formed of a silicone or other adhesive, leading to a less than robust conductive side coating.

It is with respect to these and other considerations that the present embodiments are provided.

BRIEF SUMMARY

In one embodiment, an electrostatic clamp system is provided. The electrostatic clamp system may include a conductive base, a ceramic body, having an inner side that is attached to the conductive base, and an outer side to face a substrate. The ceramic body may include an electrode assembly. The electrostatic clamp system may further include a charge control assembly. The charge control assembly may define an electrically conductive structure that is isolated from the electrode assembly and extends through the conductive base to an upper surface of the outer side of the ceramic body.

In another embodiment a processing system is provided. The processing system may include a process chamber, and an electrostatic clamp system that is disposed within the process chamber. The electrostatic clamp system may include a conductive base and a ceramic body, having an inner side that is attached to the conductive base, and an outer side to face a substrate. The ceramic body may include an electrode assembly. The electrostatic clamp system may further include a charge control assembly, wherein the charge control assembly defines an electrically conductive structure that is isolated from the electrode assembly and extends through the conductive base to an upper surface of the outer side of the ceramic body.

In a further embodiment, a method of processing a substrate is provided. The method may include placing the substrate on an electrostatic clamp system. As such, the electrostatic clamp system may include a conductive base and a ceramic body, having an inner side that is attached to the conductive base, and an outer side to face a substrate, where the ceramic body further includes an electrode assembly. The electrostatic clamp system may also include a charge control assembly that defines an electrically conductive structure that is isolated from the electrode assembly and extends through the conductive base to a surface coating disposed on an upper surface of the outer side of the ceramic body. The method may also include reversibly electrically connecting the surface coating via the charge control assembly to an external ground or to an external voltage source.

BRIEF DESCRIPTION OF THE DRAWINGS

FIG. 6 shows an exemplary process flow;

FIG. 7 shows another exemplary process flow; and

FIG. 8 shows a further exemplary process flow.

DETAILED DESCRIPTION

As detailed with respect to the figures to follow, in various embodiments, a novel electrostatic clamp system is provided with a charge control assembly that provides an independent system to remove charge, add charge, or monitor charge state with respect to a substrate being processed by an electrostatic clamp.

Figure 1A:
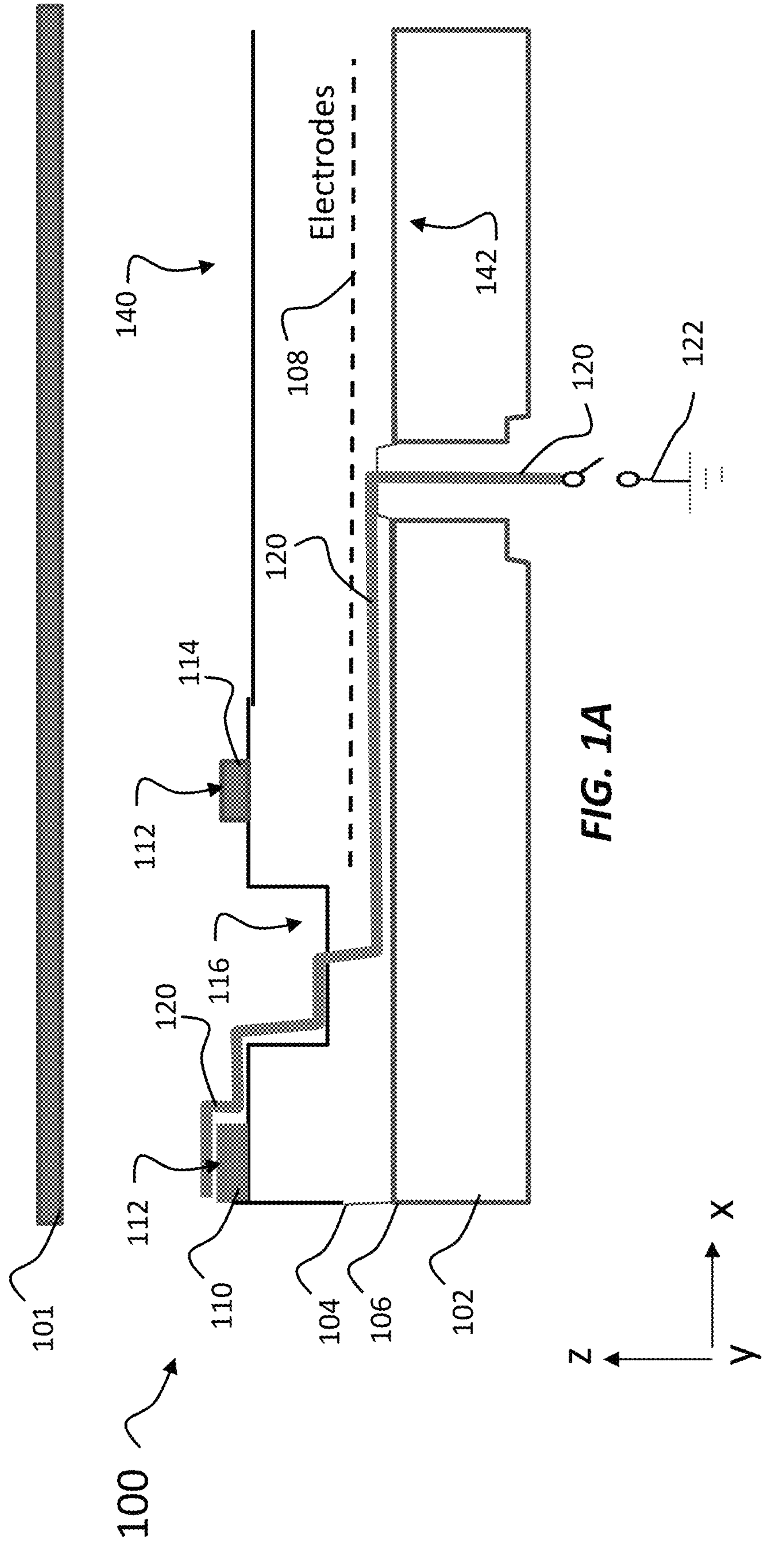
FIG. 1A depicts a side cross sectional view of an electrostatic clamp system according to embodiments of the disclosure.

FIG. 1A depicts a side cross sectional view of an electrostatic clamp system 100, according to embodiments of the disclosure. The electrostatic clamp system 100 may include a conductive base 102, a ceramic body 104 having an inner side 142 that is attached to the conductive base 102, for example, via an epoxy layer 106, and has an outer side 140 to face a substrate, the ceramic body 104 including an electrode assembly 108. The electrostatic clamp system 100 may be arranged in some aspects as in known electrostatic clamps, where the conductive base 102 may be a metal, such as aluminum, and the ceramic body 104 is a suitable ceramic material that is an electrical insulator or leaky insulator. The electrode assembly 108 may be embedded within the ceramic body 104 as in known electrostatic clamps, where the electrode assembly 108 has any suitable configuration and distribution with the electrostatic clamp. The electrode assembly 108 will be coupled to an external source to bias the electrode assembly so as to generate an electric field across the ceramic body so as to clamp the substrate to the upper surface 112 of the outer side 140.

The electrostatic clamp system 100 may further include a charge control assembly 120 that provides an electrical path extending from the upper surface 112 to an external component, such as an external ground, or external voltage source. In particular, the charge control assembly 120 defines an electrically conductive structure that is isolated from the electrode assembly 108 and extends through the conductive base 102 to the upper surface 112. In so doing, the charge control assembly 120 provides a means to bleed to charge or add charge to a substrate 101, in contact with the upper surface 112, or to monitor a charge state of the substrate 101.

The charge control assembly 120 may be formed of any suitable component or set of components that are electrically conductive. As further shown in FIG. 1A, the charge control assembly 120 may have a portion that is embedded in the ceramic body 104, and a portion that is exposed on the outer side 140. In the embodiment of FIG. 1A, the ceramic body 104 includes a sealing ring 110, disposed on a perimeter of the ceramic body 104, where the outside of sealing ring 110 may define the upper surface 112. In this embodiment, the ceramic body 104 further includes a gas cooling channel, shown as cooling channel 116, disposed inside the sealing ring 110. As shown, the charge control assembly 120 extends from within the bulk of the ceramic body 104 and into the cooling channel 116, and from the cooling channel 116 to the sealing ring 110.

Figure 1B:
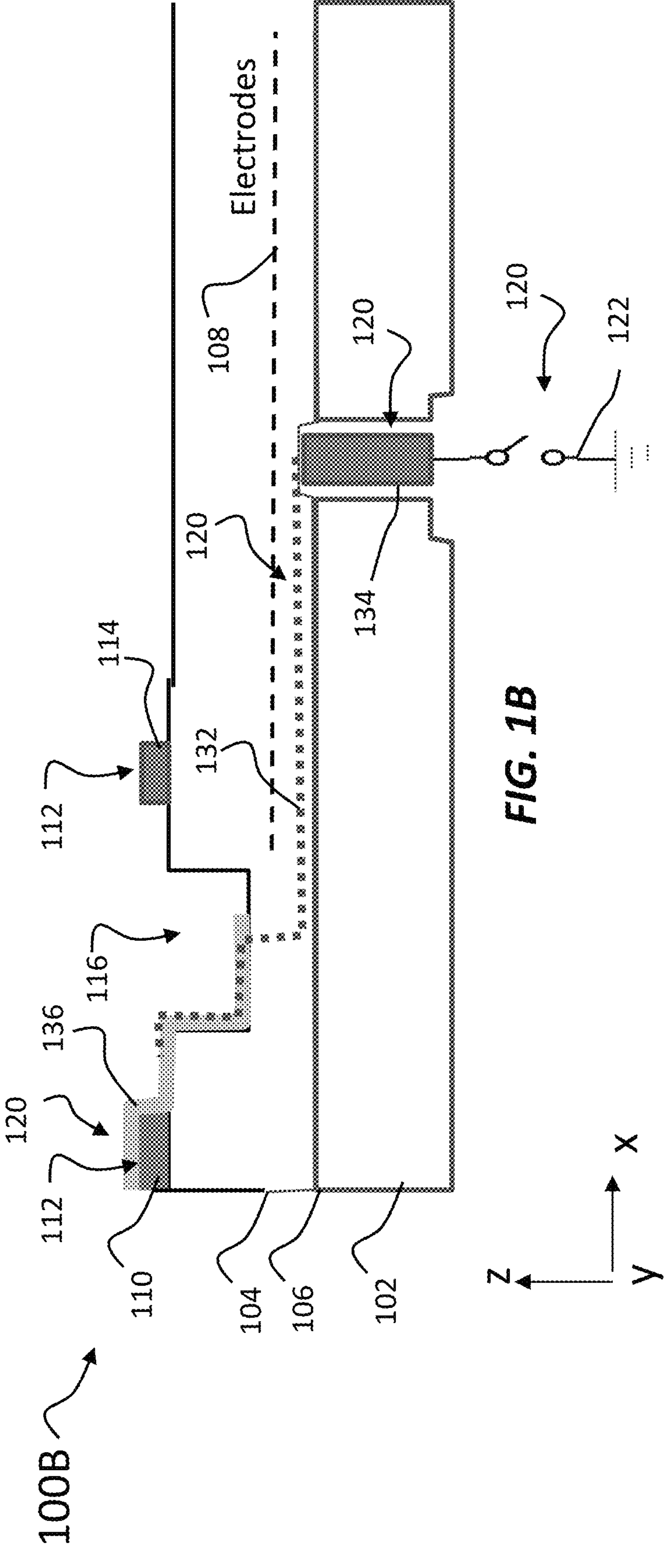
FIG. 1B depicts a side cross sectional view of another electrostatic clamp system according to embodiments of the disclosure.

FIG. 1B depicts a side cross sectional view of another electrostatic clamp system, shown as electrostatic clamp system 100B, according to embodiments of the disclosure. This system may be similar to electrostatic clamp system 100, with like components labeled the same. In this embodiment, a variant of the charge control assembly 120 is shown. The charge control assembly 120 in this variant includes several different components, including a conductive pin 134, extending through the conductive base 102, an embedded layer 132, disposed within the ceramic body 104, and electrically isolated from the conductive base 102 and the electrode assembly 108. The charge control assembly 120 in the embodiment of FIG. 1B further includes a surface coating 136, connected to the embedded layer 132, and disposed over a substrate support structure of the ceramic block, in this case, the sealing ring 110. According to different non-limiting embodiments, the embedded layer 132 may be a mesh, a foil, a layer formed by screen print, a deposited layer, a set of wires, and so forth. As illustrated in FIG. 1B, the embedded layer 132 and surface coating 136 may overlap in the region of the sealing ring 110 and cooling channel 116.

According to various non-limiting embodiments, the surface coating 136 may be formed of TiN, doped-diamondlike carbon, SiC, Y, Ti, Mo, or combinations thereof. According to embodiments of the disclosure, the surface coating 136 may be formed of any suitable electrically conductive, and corrosion-resistant material. According to various non-limiting embodiments, the thickness of the surface coating 136 may range between 3 mm and 10 mm. In other embodiments, the thickness of surface coating 136 may be less than 3 mm or greater than 10 mm, with a consideration for suitable thickness being the planned duration of the surface coating 136. Advantages of having the surface coating 136 located above the sealing ring is that the surface coating thus provides a grounding surface to prevent substrate charging at the outer diameter of the substrate 101, and also minimizes the likelihood of forming a substrate (wafer) discharge or micro arc.

Figures 2, 3:
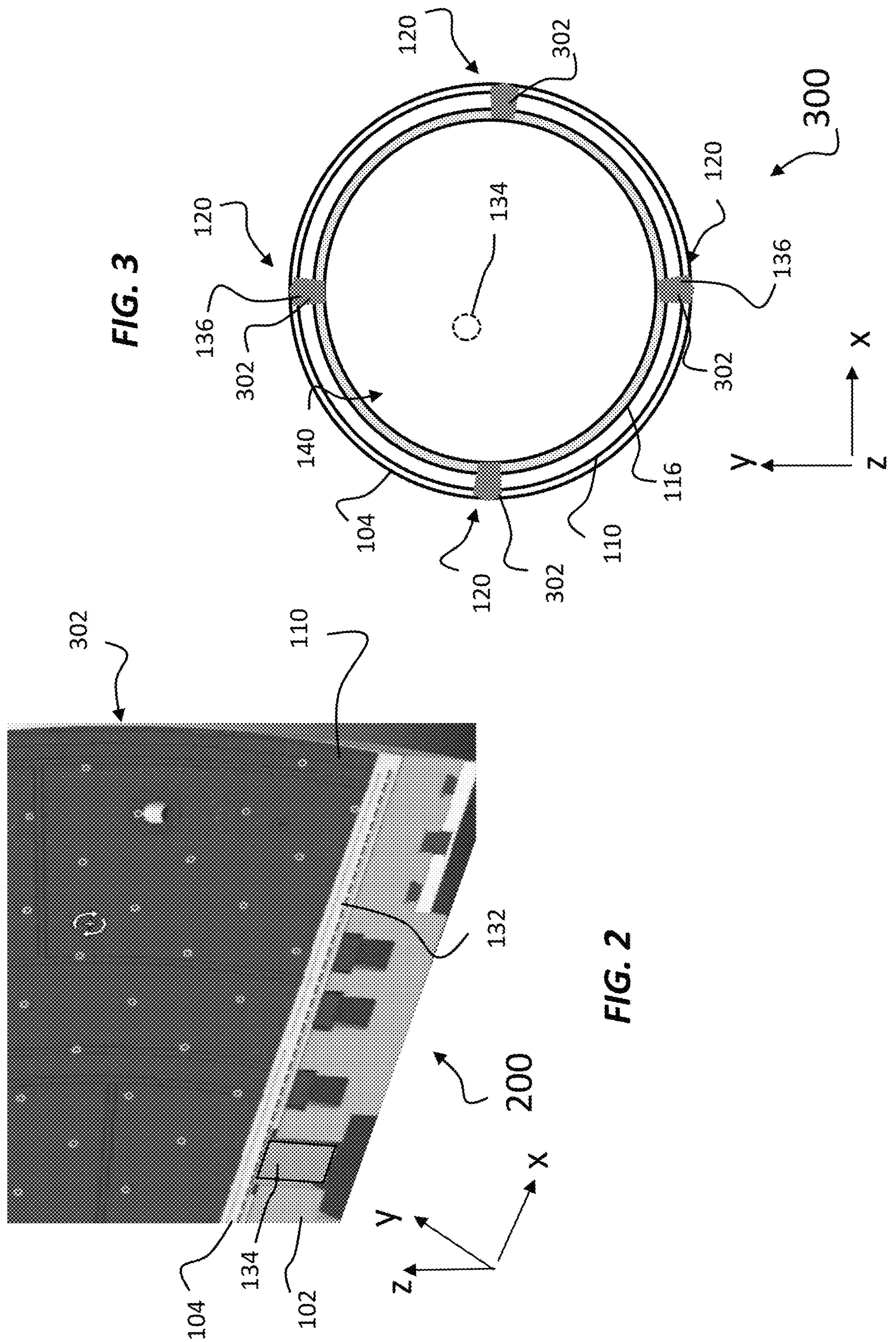
FIG. 2 depicts an isometric cross sectional view of an electrostatic clamp according to various embodiments of the disclosure.
FIG. 3 depicts a top view of another electrostatic clamp system according to embodiments of the disclosure.

FIG. 2 depicts an isometric cross sectional view of an electrostatic clamp 200 according to various embodiments of the disclosure. The electrostatic clamp 200 may be deemed to be a variant of the electrostatic clamp system 100B of FIG. 1B, with like components labeled the same. In this example, the conductive base 102 and ceramic body 104 form a circular platen, shown as platen. As shown in FIG. 2, the conductive pin 134 is located inside of the sealing ring 110, such that electric coupling from the conductive pint to a surface coating located at the sealing ring 110 takes place via the embedded layer 132, which layer may extend in a planar fashion throughout a majority of the ceramic body 104 within the X-Y plane of the Cartesian coordinate system shown.

FIG. 3 depicts a top view of another electrostatic clamp system according to embodiments of the disclosure. The electrostatic clamp 300 may be deemed to be a variant of the electrostatic clamp system 100B, with like components labeled the same. In this example, the charge control assembly 120 is arranged in a manner that a plurality of conductive segments are disposed on the outer side 140 of the ceramic body 104. As noted previously, the surface coating 136 may be deposited over a region along the periphery of the ceramic body 104, such as a sealing ring 110, and may extend to a cooling channel 116, located inside of the cooling channel 116. In the embodiment of FIG. 3, the plurality of conductive segments are shown as conductive segments 302, located over small portions of the sealing ring 110 and cooling channel 116, at the periphery of the ceramic body, meaning at the outer edge. It may be understood that the illustration of the different features of the figures is not drawn to scale. Thus, while the diameter of the ceramic body 104 may be, for example, 300 mm or greater, the cooling channel 116 may be located within 10 mm of the outer edge of the ceramic body 104, for example. Moreover, the conductive segments 302 as a whole may occupy just several degrees of arc of the 360 degrees as defined by the ceramic body, such as 10 degrees or less, according to some non-limiting embodiments. In this manner, the area of the conductive segments 302 that comes into contact with a substrate 101 may be relatively small in comparison to total substrate error and may minimally affect operation of the electrostatic clamp 300 during clamping operation. It may also be understood that the embedded layer 132 is arranged in a planar fashion within the X-Y plane so as to cover a majority of the area defined by the ceramic body 104, in a manner that electrically connects the conductive pin 134 to the conductive segments 302. Thus, just at the locations represented by the conductive segments 302 will the embedded layer 132 be extended from inside the ceramic body 104 to as to overlap with the surface coating 136.

Note that in the embodiment of FIG. 3, the conductive segments 302 are arranged as four segments, symmetrically position around the periphery of the ceramic body 104. According to various embodiments of the disclosure, the charge control assembly 120 may be arranged with just one conductive segment, while in other embodiments the number of conductive segments 302 is two or more, and the conductive segments 302 are arranged in a symmetrical fashion. Moreover, while the charge control assembly 120 in the aforementioned embodiments is arranged with a conductive segment that is disposed toward the periphery of the ceramic body, such as on the sealing ring 110, in other embodiments, a conductive segment may be arranged more toward the middle of the ceramic body, such as on the upper surface of an embossment, such as on the embossment 114 of FIG. 1A or FIG. 1B. In any case, the conductive segment portion of a charge control assembly will be arranged to touch a substrate 101, when the substrate 101 is placed upon the ceramic body 104.

Note that in any of the aforementioned embodiments, the charge control assembly 120 may be arranged with a switch 122, so that the conductive segments located on the outer side of the ceramic body may be reversibly coupled or decoupled from an external ground, or an external voltage source (not separately shown). In this manner, conductive segments 302 may be grounded or biased at a desired potential at a suitable instance, such as during declamping. Moreover, in additional embodiments, a charge control assembly may include a monitor, coupled to the conductive segments, to determine a charge state of the electrostatic clamp.

Figure 4:
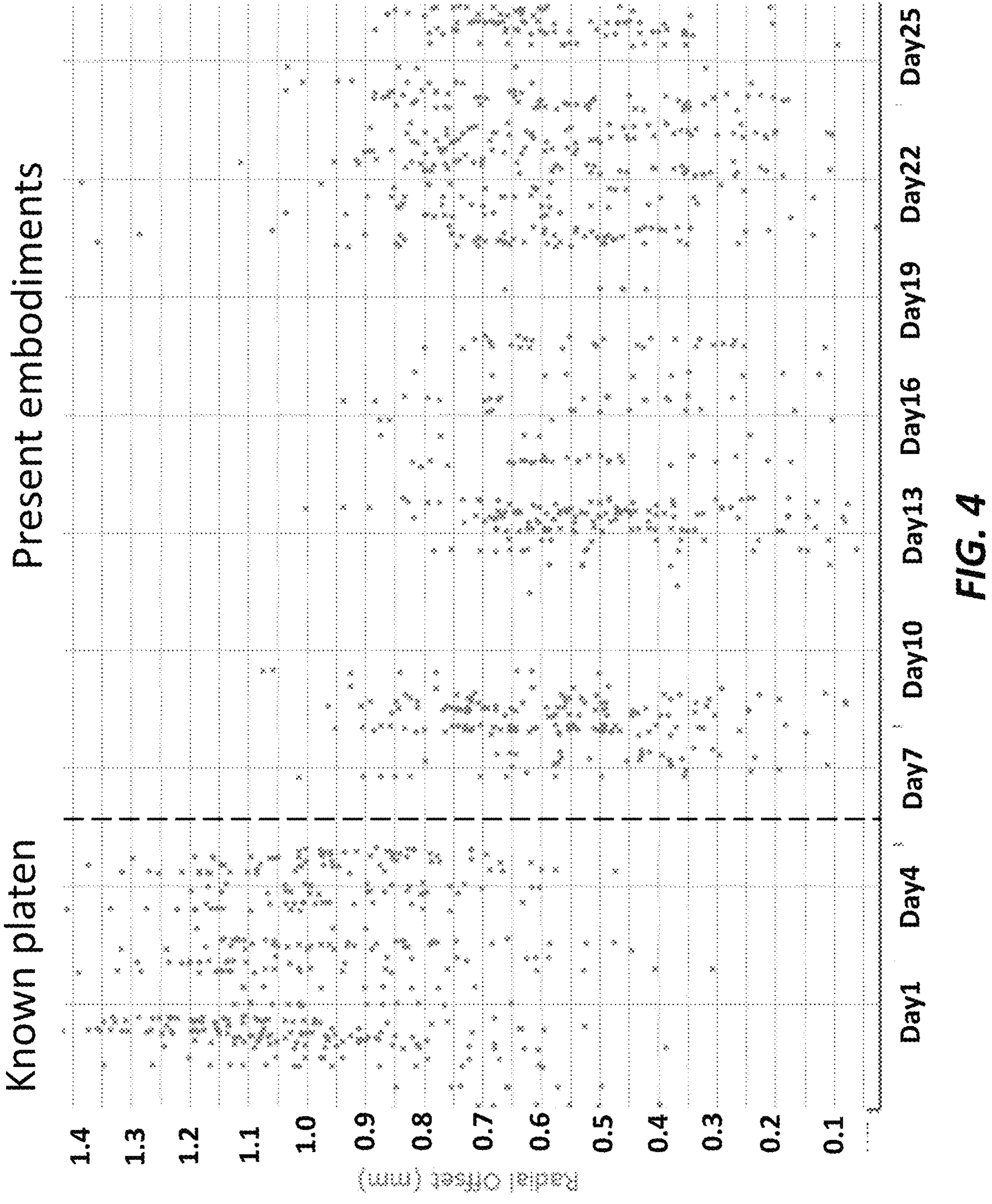
FIG. 4 is a graph showing the results of radial offset measurements during a marathon wafer processing, comparing a known platen and a platen arranged according to the present embodiments.

Turning now to FIG. 4 there is shown a graph showing the results of radial offset measurements during a marathon wafer processing, comparing a known platen of an electrostatic clamp and a platen of an electrostatic clamp arranged according to the present embodiments. The radial offset represents a wafer handling parameter for an electrostatic clamp where lower radial offset is desired. As shown in FIG. 4, the known electrostatic clamp exhibits a median radial offset of approximately 1.0 mm, while the electrostatic clamp arranged with a charge control assembly according to the present embodiments exhibits a much smaller wafer offset, approximately 0.6 mm.

Figure 5:
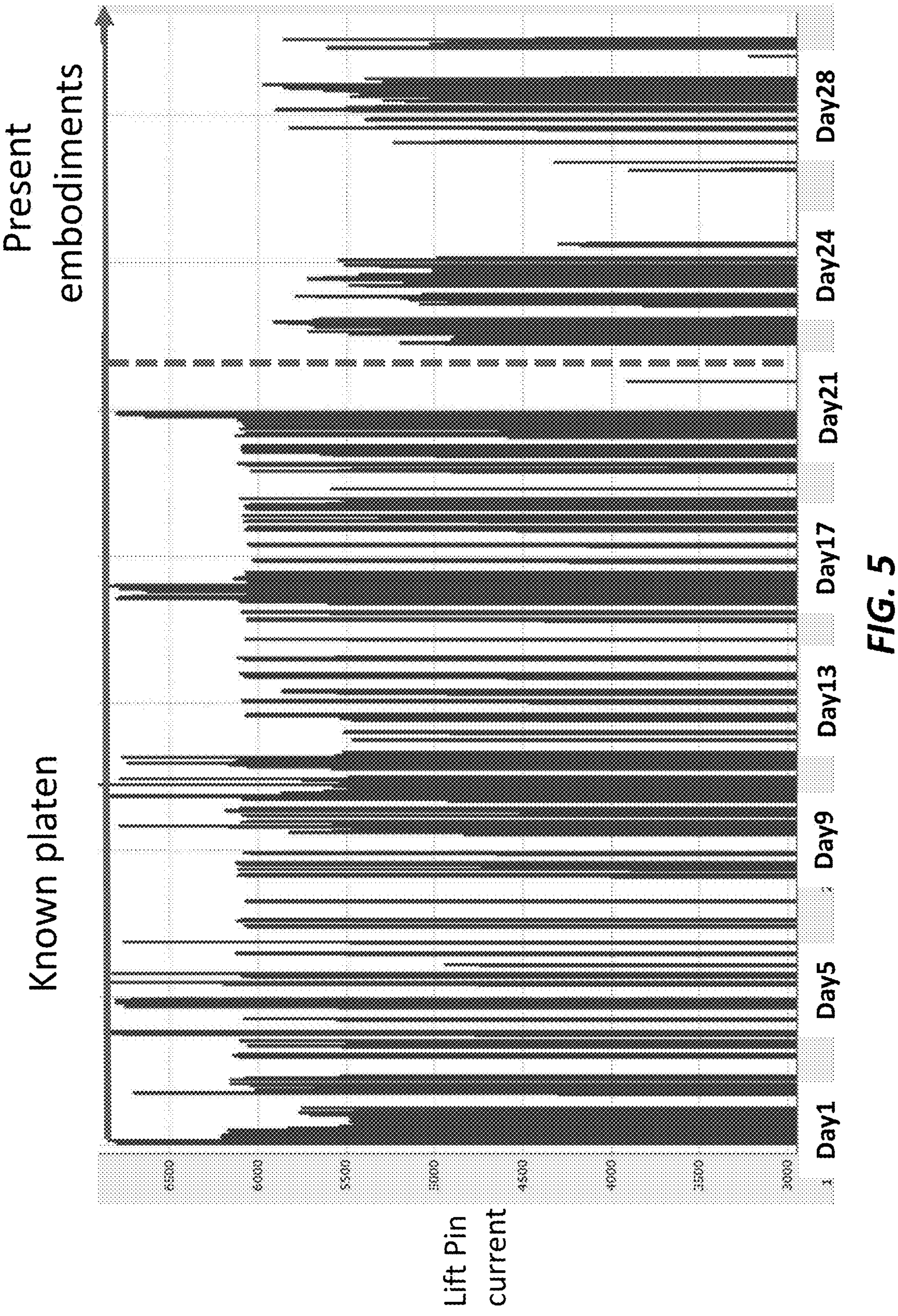
FIG. 5 is a graph showing the results of lift pin drive current measurements during a marathon wafer processing, comparing a known platen and a platen arranged according to the present embodiments.

FIG. 5 is a graph showing the results of lift pin drive current measurements during a marathon wafer processing, comparing a known platen and a platen arranged according to the present embodiments. The lift pin motor current indicates that current required to lift wafers from contact with the electrostatic clamp. As shown in FIG. 4, the platen of the electrostatic clamp having the charge control assembly of the present embodiments requires less current, indicative of less wafer sticking to the electrostatic clamp.

Figures 6, 7, 8:
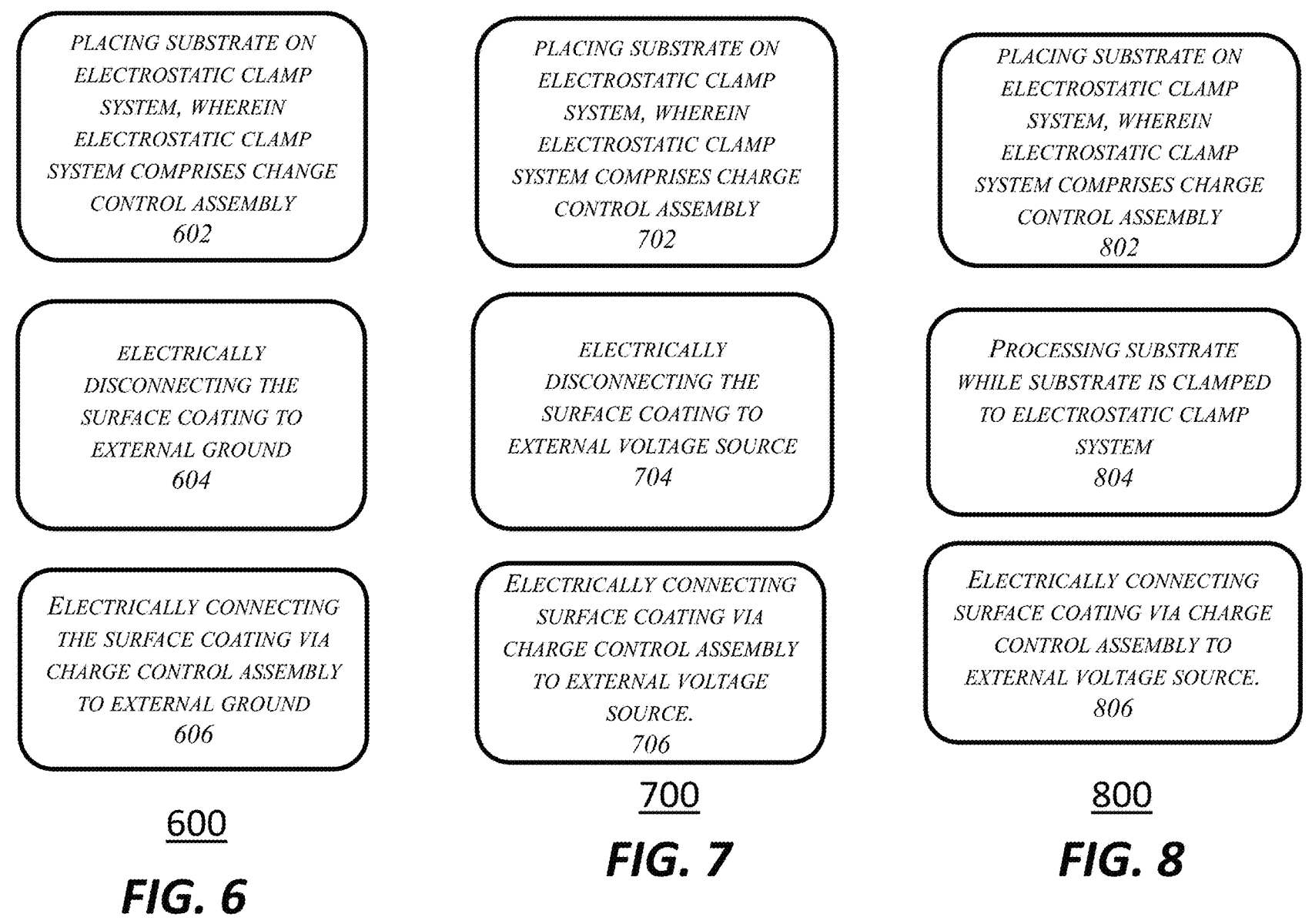

FIG. 6 depicts an exemplary process flow 600. At block 602, a substrate is placed on an electrostatic clamp system, wherein the electrostatic clamp system has a change control assembly. In one example, the electrostatic clamp system may include a ceramic body, having an inner side that is attached to a conductive base, and an outer side that faces the substrate. The ceramic body may include an electrode assembly that is used to generate a field for electrostatic clamping. The charge control assembly may define an electrically conductive structure or set of structures that is isolated from the electrode assembly and extends through the conductive base to a surface coating disposed on an upper surface of the outer side of the ceramic body. Thus, the surface coating may be in contact with the substrate when the substrate is placed on the electrostatic clamp system.

At block 604, at a first instance, the surface coating is electrically disconnected to an external ground. In one example, a switch may be provided that provides a reversible connection of the surface coating to ground via the charge control assembly. In this manner, the switch may be kept in an open position such that the surface coating is allowed to float at the first instance, where the first instance corresponds to a time for clamping of the substrate to the ceramic body in order to begin substrate processing.

At block 606, at a second instance, the surface coating is electrically connected to external ground via the charge control assembly. In one example, a switch may be provided that provides a reversible connection of the surface coating to ground. In this manner, the surface coating may be grounded at the second instance by closing the switch, such as when the second instance corresponds to a time for declamping of the substrate.

FIG. 7 depicts another exemplary process flow 700. At block 702, a substrate is placed on an electrostatic clamp system, wherein the electrostatic clamp system has a change control assembly. In one example, the electrostatic clamp system may include a ceramic body, having an inner side that is attached to a conductive base, and an outer side that faces the substrate. The ceramic body may include an electrode assembly that is used to generate a field for electrostatic clamping. The charge control assembly may define an electrically conductive structure or set of structures that is isolated from the electrode assembly and extends through the conductive base to a surface coating disposed on an upper surface of the outer side of the ceramic body. Thus, the surface coating may be in contact with the substrate when the substrate is placed on the electrostatic clamp system.

At block 704, at a first instance, the surface coating is electrically disconnected to an external voltage source. In one example, a switch may be provided that provides a reversible connection of the surface coating to the external voltage source. In this manner, the surface coating may be allowed to float at the first instance by opening the switch, such as where the first instance corresponds to a time for clamping of the substrate to the ceramic body in order to begin substrate processing.

At block 706, at a second instance, the surface coating is electrically connected to the external voltage source via the charge control assembly. In one example, a switch may be provided that provides a reversible connection of the surface coating to the external voltage source. In this manner, at the second instance, by closing the switch the surface coating may be connected to a suitable electrical potential provided by the external voltage source, such as where the second instance corresponds to a time for declamping of the substrate.

FIG. 8 depicts another exemplary process flow 800. At block 802, a substrate is placed on an electrostatic clamp system, wherein the electrostatic clamp system has a change control assembly. In one example, the electrostatic clamp system may include a ceramic body, having an inner side that is attached to a conductive base, and an outer side that faces the substrate. The ceramic body may include an electrode assembly that is used to generate a field for electrostatic clamping. The charge control assembly may define an electrically conductive structure or set of structures that is isolated from the electrode assembly and extends through the conductive base to a surface coating disposed on an upper surface of the outer side of the ceramic body. Thus, the surface coating may be in contact with the substrate when the substrate is placed on the electrostatic clamp system.

At block 804, the substrate is processed while being clamped to the electrostatic clamp system. In one embodiment, a switch may be provided that provides a reversible connection of the surface coating to the external voltage source. In this manner, by opening the switch, the surface coating may be allowed to float during the substrate processing.

At block 806, the surface coating is electrically connected to an external monitor. In this manner, the charge state of the surface coating may be probed. For instance, the switch may be closed after a period of substrate processing to electrically connect the surface coating to the external monitor via the charge control assembly, in order to probe the charge buildup on the surface coating after the period of processing. The electrical connection to the external monitor may take place while the substrate is being processed or after processing has ceased according to different embodiments.

In sum, the present embodiments provide a novel approach to control the charge at a substrate positioned on an electrostatic clamp, with the benefits of aiding substrate declamping by reducing substrate sticking, as well improving substrate positioning. The present embodiments further help to avoid substrate discharge or microarcs, and reduce particle generations and yield loss.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that the usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An electrostatic clamp system, comprising:

a conductive base;

a ceramic body, having an inner side that is attached to the conductive base, and an outer side opposing the inner side and configured to face a substrate, the ceramic body including an electrode assembly; and a charge control assembly, the charge control assembly defining an electrically conductive structure that is electrically isolated from and not connected to the electrode assembly, wherein the electrically conductive structure is separate from the electrode assembly and is independently coupleable to an external ground or an external voltage source that is different from a voltage source used to bias the electrode assembly, and wherein the electrically conductive structure extends through the conductive base to an upper surface of the outer side of the ceramic body that is configured to contact the substrate.

2. The electrostatic clamp of claim 1, the charge control assembly comprising:

a conductive pin, extending through the conductive base;

an embedded layer, disposed within the ceramic body, and electrically isolated from the conductive base and the electrode assembly; and a surface coating, connected to the embedded layer and being disposed over a substrate support structure of the ceramic body.

3. The electrostatic clamp system of claim 2, wherein the embedded layer comprises a mesh, a foil, screen print or a deposited layer.

4. The electrostatic clamp system of claim 2, wherein the surface coating is disposed in a plurality of conductive segments that are disposed to touch a substrate, when placed on the ceramic body.

5. The electrostatic clamp system of claim 4, wherein the plurality of conductive segments comprise two or more conductive segments, arranged symmetrically along a periphery of the ceramic body.

6. The electrostatic clamp system of claim 4, wherein the plurality of conductive segments occupy less than ten degrees of arc along a periphery of the ceramic body.

7. The electrostatic clamp system of claim 2, wherein the ceramic body further comprises:

a sealing ring, disposed along a perimeter of the conductive coating, the sealing ring defining the upper surface of the outer side of the ceramic body; and a gas cooling channel, disposed inside of the sealing ring, wherein the surface coating extends in a continuous fashion over the sealing ring and gas cooling channel, and wherein the embedded layer extends at least into the gas cooling channel.

8. The electrostatic clamp system of claim 1, wherein the charge control assembly is electrically isolated from the conductive base, wherein the charge control assembly further comprises a switch, arranged to reversibly couple or decouple the electrically conductive structure from an external ground or an external voltage source.

9. The electrostatic clamp system of claim 2, wherein the surface coating comprises TiN, doped-diamondlike carbon, SiC, Y, Ti, or Mo.

10. The electrostatic clamp system of claim 1, the charge control assembly further comprising a monitor, coupled to the electrically conductive structure, to determine a charge state of the electrostatic clamp.

11. A processing system, comprising:

a process chamber; and an electrostatic clamp system, disposed within the process chamber, the electrostatic clamp system comprising:

a conductive base;

a ceramic body, having an inner side that is attached to the conductive base, and an outer side opposing the inner side and configured to face a substrate, the ceramic body including an electrode assembly; and a charge control assembly, the charge control assembly defining an electrically conductive structure that is electrically isolated from and not connected to the electrode assembly, wherein the electrically conductive structure is separate from the electrode assembly and is independently coupleable to an external ground or an external voltage source that is different from a voltage source used to bias the electrode assembly, and wherein the electrically conductive structure extends through the conductive base to an upper surface of the outer side of the ceramic body that is configured to contact the substrate.

12. The processing system of claim 11, the charge control assembly comprising:

a conductive pin, extending through the conductive base;

an embedded layer, disposed within the ceramic body, and electrically isolated from the conductive base and the electrode assembly; and a surface coating, connected to the embedded layer and being disposed over a substrate support structure of the ceramic body.

13. The processing system of claim 12, wherein the embedded layer comprises a mesh, a foil, screen print or a deposited layer.

14. The processing system of claim 12, wherein the surface coating is disposed in a plurality of conductive segments that are disposed to touch a substrate, when placed on the ceramic body.

15. The processing system of claim 14, wherein the plurality of conductive segments comprise two or more conductive segments, arranged symmetrically along a periphery of the ceramic body.

16. The processing system of claim 14, wherein the plurality of conductive segments occupy less than ten degrees of arc along a periphery of the ceramic body.

17. The processing system of claim 12, wherein the ceramic body further comprises:

a sealing ring, disposed along a perimeter of the conductive coating, the sealing ring defining the upper surface of the outer side of the ceramic body; and a gas cooling channel, disposed inside of the sealing ring, wherein the surface coating extends in a continuous fashion over the sealing ring and gas cooling channel, and wherein the embedded layer extends at least into the gas cooling channel.

18. The processing system of claim 11, wherein the charge control assembly is electrically isolated from the conductive base, wherein the charge control assembly further comprises a switch, arranged to reversibly couple or decouple the electrically conductive structure from an external ground or an external voltage source.

19. A method of processing a substrate, comprising:

placing the substrate on an electrostatic clamp system, wherein the electrostatic clamp system comprises:

a conductive base;

a ceramic body, having an inner side that is attached to the conductive base, and an outer side opposing the inner side and configured to face a substrate, the ceramic body including an electrode assembly; and a charge control assembly, the charge control assembly defining an electrically conductive structure that is electrically isolated from and not connected to the electrode assembly, wherein the electrically conductive structure is separate from the electrode assembly and is independently coupleable to an external ground or an external voltage source that is different from a voltage source used to bias the electrode assembly, and wherein the electrically conductive structure extends through the conductive base to an upper surface of the outer side of the ceramic body that is configured to contact the substrate; and reversibly electrically connecting the surface coating via the charge control assembly to an external ground or to an external voltage source.

20. The method of claim 19, further comprising:

processing the substrate while the substrate is clamped to the electrostatic clamp system; and electrically connecting the surface coating to an external monitor to monitor a charge state of the surface coating after the processing or during the processing.

* * * * *